United States Patent
Cohn et al.

(10) Patent No.: US 7,276,789 B1
(45) Date of Patent: Oct. 2, 2007

(54) MICROELECTROMECHANICAL SYSTEMS USING THERMOCOMPRESSION BONDING

(75) Inventors: Michael B. Cohn, Berkeley, CA (US); Joseph T. Kung, Santa Clara, CA (US)

(73) Assignee: Microassembly Technologies, Inc., Richmond, CA (US)

( * ) Notice: Subject to any disclaimer, the term of this patent is extended or adjusted under 35 U.S.C. 154(b) by 131 days.

(21) Appl. No.: 10/851,751

(22) Filed: May 20, 2004

Related U.S. Application Data

(60) Continuation of application No. 10/377,999, filed on Feb. 28, 2003, now Pat. No. 6,853,067, which is a division of application No. 09/687,480, filed on Oct. 12, 2000, now abandoned.

(60) Provisional application No. 60/159,026, filed on Oct. 12, 1999.

(51) Int. Cl.
*H01L 23/12* (2006.01)

(52) U.S. Cl. .................................... 257/704; 257/724

(58) Field of Classification Search ............... 257/704, 257/E23.183, E23.125
See application file for complete search history.

(56) References Cited

U.S. PATENT DOCUMENTS

| | | |
|---|---|---|
| 5,258,591 A | 11/1993 | Buck |
| 5,367,136 A | 11/1994 | Buck |
| 5,430,421 A | 7/1995 | Bornand et al. |
| 5,472,539 A | 12/1995 | Saia et al. |
| 5,578,869 A | 11/1996 | Hoffman et al. |
| 5,578,976 A | 11/1996 | Yao |
| 5,600,071 A | 2/1997 | Sooriakumar et al. |
| 5,629,918 A | 5/1997 | Ho et al. |
| 5,659,195 A | 8/1997 | Kaiser et al. |
| 5,744,752 A | 4/1998 | McHerron et al. |
| 5,778,513 A | 7/1998 | Miu et al. |
| 5,874,675 A | 2/1999 | Edmans et al. |
| 5,938,956 A * | 8/1999 | Hembree et al. ........... 219/209 |
| 5,949,655 A | 9/1999 | Glenn |
| 5,995,688 A | 11/1999 | Aksyuk et al. |
| 6,000,280 A | 12/1999 | Miller et al. |
| 6,025,767 A | 2/2000 | Kellam et al. |

(Continued)

FOREIGN PATENT DOCUMENTS

WO WO98/09312 3/1998

(Continued)

OTHER PUBLICATIONS

PCT International Search Report, International Application No. PCT/US01/45132, Sep. 23, 2002.

(Continued)

*Primary Examiner*—W. David Coleman
(74) *Attorney, Agent, or Firm*—Fenwick & West LLP

(57) ABSTRACT

Improved microelectromechanical systems (MEMS), processes and apparatus using thermocompression bonding are disclosed. For example, process embodiments are disclosed in which wafer-scale as well as die-scale thermocompression bonding is utilized to encapsulate MEMS and/or to provide electrical interconnections with MEMS. Apparatus embodiments include apparatus for performing thermocompression bonding and bonded hybrid structures manufactured in accordance with the process embodiments. Devices having various substrate bonding and/or sealing configurations variously offer the advantage of reduced size, higher manufacturing yields, reduced costs, improved reliability, improved compatibility with existing semiconductor manufacturing process and/or greater versatility of applications.

29 Claims, 6 Drawing Sheets

U.S. PATENT DOCUMENTS

| | | | |
|---|---|---|---|
| 6,066,515 | A | 5/2000 | Schoenfeld |
| 6,124,650 | A | 9/2000 | Bishop et al. |
| 6,158,283 | A | 12/2000 | Shinogi et al. |
| 6,287,894 | B1 | 9/2001 | Sawin |
| 6,297,072 | B1 | 10/2001 | Tilmans et al. |
| 6,346,742 | B1 | 2/2002 | Bryzek et al. |
| 6,426,484 | B1 | 7/2002 | Hembree et al. |
| 6,469,602 | B2 | 10/2002 | Ruan et al. |
| 6,566,745 | B1 | 5/2003 | Beyne et al. |
| 6,614,110 | B1 | 9/2003 | Pace |
| 6,621,616 | B1 | 9/2003 | Bauer et al. |
| 2002/0171144 | A1 | 11/2002 | Zhang et al. |

FOREIGN PATENT DOCUMENTS

| | | |
|---|---|---|
| WO | WO99/17322 | 4/1999 |

OTHER PUBLICATIONS

PCT Written Opinion, International Application No. PCT/US01/45132, Feb. 25, 2003, 4 pages.

M. Sakata et al., "Micromachined relay which utilizes single crystal silicon electrostatic actuator," Proc. IEEE MicroElectroMechanical Systems: MEMS-99, pp. 21-24, Orlando, Florida, USA, Jan. 1999.

* cited by examiner

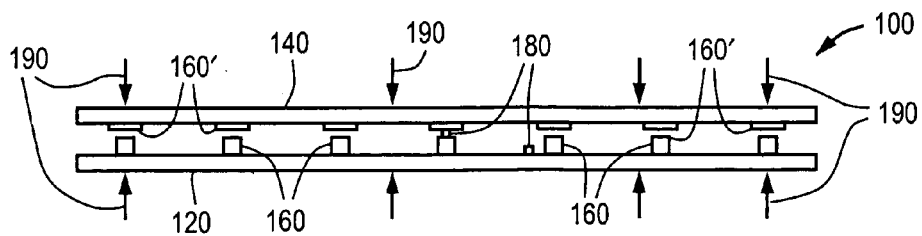
FIG. 1a
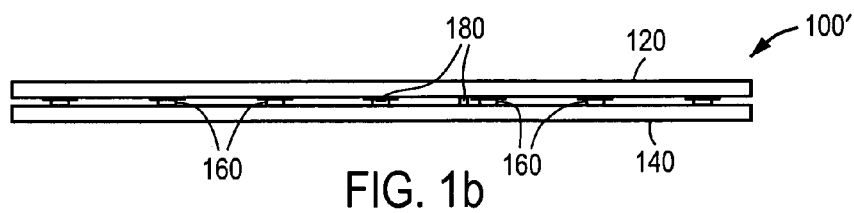
FIG. 1b
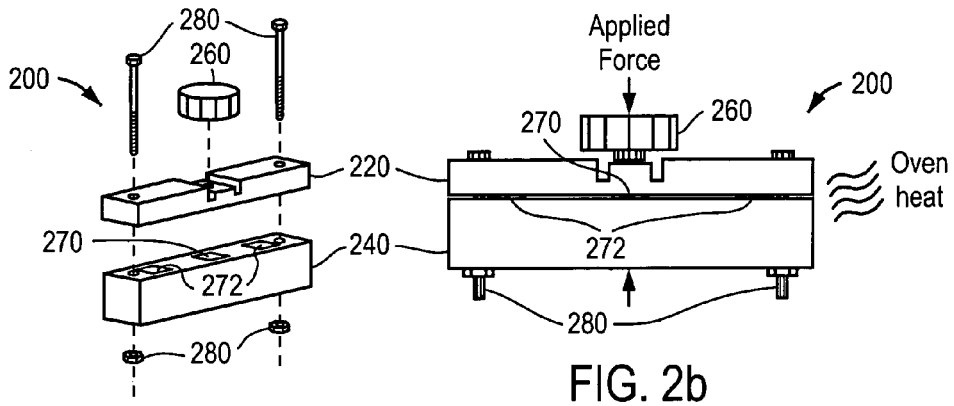
FIG. 2a
FIG. 2b
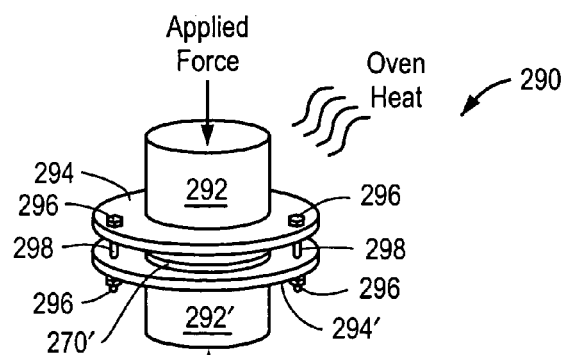
FIG. 2c

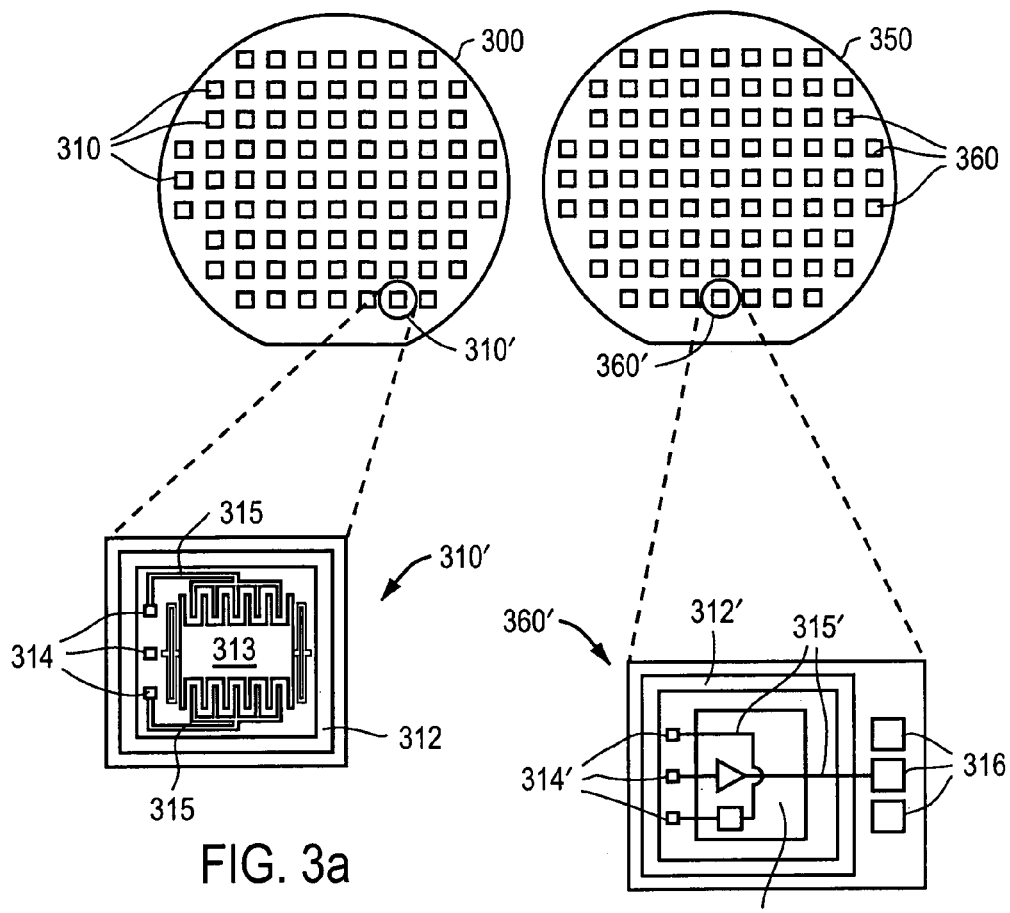
FIG. 3a
FIG. 3b
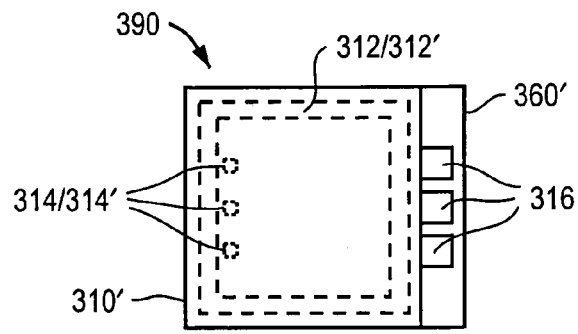
FIG. 3c

MICROELECTROMECHANICAL SYSTEMS USING THERMOCOMPRESSION BONDING

CROSS-REFERENCE TO RELATED APPLICATION

This application is a continuation of U.S. patent application Ser. No. 10/377,999, filed Feb. 28, 2003, now patented and bearing U.S. Pat. No. 6,853,067, which is a divisional of U.S. patent application Ser. No. 09/687,480, filed Oct. 12, 2000, now abandoned, which claims the benefit of U.S. Provisional Application No. 60/159,026, filed Oct. 12, 1999.

STATEMENT REGARDING FEDERALLY SPONSORED RESEARCH OR DEVELOPMENT

This invention was made with Government support under Contract DAAH01-99-C-R038 awarded by the U.S. Army Aviation and Missile Command. The Government has certain rights in the invention.

BACKGROUND OF THE INVENTION

1. Field of the Invention

The present invention relates to the packaging of semiconductor devices, and, more particularly, to the use of thermocompression bonding in the packaging of microelectromechanical systems (MEMS). Accordingly, the general objects of the invention are to provide novel methods and apparatus of such character.

2. Description of Related Art

In the past 15 years, many types of electromechanical sensors have been manufactured using integrated circuit (IC) fabrication techniques. Although they are generally fabricated on silicon wafers, these "microelectromechanical devices" or "MEMS" are different from most ICs in that they possess moving elements. Although MEMS devices are even more vulnerable to contamination and moisture than most ICs, they cannot be encapsulated in a typical injection-molded plastic package because at least one element of every microelectromechanical device must remain free to move. The packaging of MEMS devices, therefore, presents unique problems.

Several specialized methods, which are directed to different stages of the fabrication process, have been employed for the sealing and packaging of MEMS. One early method directed to the final packaging stage employs a ceramic package with a co-fired lead frame, a cavity to contain a complete MEMS chip and lid to cover the package and cavity. With this chip-scale packaging method, the MEMS chip is placed in the cavity and the lid is soldered in place to create a hermetic seal. One problem with this chip-scale packaging approach is the expense associated with handling the individual components (e.g., the packages, lids, etc.) and assembling them into a single package. An additional problem with this chip-scale packaging approach is that the moving elements in MEMS are extremely fragile and tend to be damaged by any handling, especially near the end of the fabrication process. Therefore, packaging yields are typically low. A further problem with this packaging approach is that the solder seal on the lid tends to outgas when reflowed during the final sealing process. If a vacuum is needed inside the package, a getter must be added, at additional cost. In such cases, packaging costs can constitute 80% of the total device cost. In sum, the use of ceramic packages to seal and package MEMS chips is inordinately expensive due to the need to individually handle components, the need to use getters and the considerable opportunity for damage and contamination of the MEMS devices.

A wafer-scale pre-packaging method of bonding two wafers together has been used to bond a wafer of silicon or glass onto a MEMS wafer. In accordance with this process, a non-conductive glass frit is screen-printed onto the lid wafer, in the shape of rings or gaskets. The wafers are then placed together to form cavities containing MEMS devices and bonded by the application of heat in excess of 400 degrees Celsius. After bonding, the two-wafer stack is diced and the resulting hybrid structures are packaged in the standard manner: by encapsulation in plastic packages such as DIPs, SOICs, etc. While this process has been marginally successful, it suffers from the deficiency that the glass frit cannot be patterned into fine features. Typically, gasket pattern line widths are between 100–200 microns. Given that MEMS are currently made with dimensions or features in the one micron size range, significant real estate must be sacrificed, thereby significantly reducing the number of devices that can be fabricated on a single wafer. Attempts have been made to improve the glass frit patterning resolution, using lithographic methods, but these have not shown success. Further, gasket patterns thinner than 100–200 microns in width do not appear to provide reliable hermetic seals, possibly because of the inherently porous nature of glass frits. Thus, it is currently believed that glass frit techniques simply cannot be applied on a smaller scale where hermetic seals are desired.

Glass frit techniques also require high temperatures of between about 450–600 Celsius for sealing to occur. One drawback of using such a high firing temperatures is that it effectively precludes the incorporation of integrated circuitry on either of the wafers bonded together. These temperatures also preclude the use of most anti-stiction coatings and hydrophobic coatings, which are desirable for improving manufacturing yields and MEMS' tolerance to moisture and shock. Such high temperatures also damage the MEMS themselves and, particularly, certain structural films deposited at lower temperatures and structures in which the film stress must be carefully controlled.

Another deficiency of glass frit techniques is that the glass frit itself employs organic binders, which outgas into the sealed cavity during firing. Since getters are not available to combat this problem, this fact precludes the use of glass frits for vacuum applications. Still another limitation of the glass frit techniques is that the sealing materials, being non-conductive, cannot be used to establish electrical coupling between the devices disposed on the bonded substrates.

Front-end wafer-scale bonding methods which can be used for sealing MEMS have also been described. These methods include anodic bonding, silicon fusion bonding, and other wafer-bonding methods employing combinations of silicon, silicon dioxide, and silicon nitride. These techniques can provide vacuum and hermetic seals and can do so with improved use of chip real estate. However, these processes have low throughput and require high temperatures for high-quality bonds because their bonding mechanisms involve solid diffusion across the bond interface. These methods also place strict constraints on the materials and processes used to form the wafers to be bonded together. Significantly, these methods are also exceptionally sensitive to the presence of even small particulate contaminants, wafer warpage, scratches, and other imperfections commonly encountered during semiconductor fabrication because such contaminants can cause large defects in the bond and reduce yield substantially. Moreover, normal variations in surface topology due to the presence of circuitry can preclude proper bonding and/or sealing using such methods.

Yet another MEMS packaging technique is known as flip-chip technology. This die-scale technique allows a silicon chip to be used as a lid for a microsensor chip. To seal the silicon and microsensor chips together, a ring of solder is patterned on the lid chip and the solder is fused to the silicon chip by the application of heat. Since the solder is relatively thick and liquefies during bonding, this technique is not as sensitive to topography or local defects as thin-film wafer bonding. However, most solders require flux, to ensure consistent bonding. The use of solder to form a seal is not compatible with present MEMS process technologies because MEMS are easily damaged by residual solder flux left after sealing has occurred. While fluxless soldering processes have been attempted, even this approach does not resolve an inherent real-estate inefficiency problem resulting from the fact that the minimum feature size of this solder-based technology is about 100 microns.

Yet another problem with solder-based flip-chip bonding is that special processing is required; not only for fabrication of the solder structures on the lid chip, but also to coat the appropriate areas of the microsensor chip with a solderable metal. Since some standard metals used by commercial IC foundries cannot be soldered directly, solder-based flip-chip technology is still expensive and of limited utility compared to the present invention. Finally, solder-based flip-chip bonding cannot be reliably performed on a wafer-scale because, for example, the normal curvature of processed wafers can exceed the solder bump height. For all of the reasons above, this chip-scale technique is disproportionately expensive relative to wafer-scale packaging/sealing techniques.

Other work in the art has consistently taught that single substrate (monolithic) designs offer the best possible performance in MEMS sensors. According to these sources, minute sensor structures produce very weak (high impedance) signals and, therefore, performance can be maximized by placing an amplifying circuit next to the sensor on the same substrate. The implicit assumption is that any signal coupled off-chip to a separate amplifying circuit would have to go via a bond pad (roughly 100×100 microns) and a bonded wire. Moreover, within the field of MEMS, there is no known reference to the idea of using small bond pads or bumps to reduce parasitic capacitance or otherwise improve the performance of a two-chip (sensor/IC) system. Possibly, this is because manufacturers have confined themselves to standard packaging techniques, such as wirebonding, flip-chip, etc.

Other sources teach that the use of gold is generally avoided in silicon technology because gold forms deep traps in silicon, destroying transistor action. Gold diffuses readily in silicon. For these reasons, gold is not allowed in wafer fabrication facilities. Use of gold in semiconductor packaging is possible, since this occurs after fabrication. MEMS, however, would require additional process steps in a cleanroom following gold deposition. Therefore, many manufacturers would be unlikely to use gold in their MEMS products.

SUMMARY OF THE INVENTION

The present invention satisfies the above needs, and overcomes the above-stated and other deficiencies of the related art, by providing methods and apparatus for thermocompressively bonding plural substrates having various structures disposed on one or more of the substrates. The inventive methods and apparatus are particularly well suited to thermocompressively bonding substrates in which at least one of the substrates includes a microelectromechanical devices and, optionally, one or more integrated circuits. Other embodiments of the invention include bonded hybrid structures including microelectromechanical devices and/or integrated circuits, which are fabricated in accordance the method and apparatus embodiments of the invention.

One method embodiment of the invention is directed to wafer-scale thermocompression bonding in which a wafer having a MEMS device is thermocompressively bonded to another wafer. This method preferably begins by disposing bonding material onto predetermined locations of one of the wafers and onto complementary locations of the other wafer. These complementary locations at least partially correspond to the predetermined locations such that the wafers can be aligned in confronting relation with the bonding features and target features becoming at least partially congruent. Finally, appropriate levels of pressure and heat are applied to the wafers until the bonding features plastically deform to thereby form thermocompressive bonds. Where conductive bonding material is utilized and where the respective wafers include integrated circuits and MEMS devices, the thermocompression bonds can serve to both bond the substrates and electrically couple the MEMS and IC.

While a wide variety of methods and materials can be used to dispose the bonding material onto the wafers, the bonding features are preferably electroplated gold, copper, lead, aluminum, indium, platinum, palladium, gold-tin, lead-tin and/or indium-lead. These bonding features can be formed in the shape of a sealing ring which, together with the wafers, can define a sealed cavity within which a MEMS device can be protected. Inter alia, this enables bonding on a wafer-scale with singulation occurring subsequently. Alternatively, process embodiments of the present invention perform thermocompression bonding on a chip-scale; in which case, singulation occurs prior to thermocompression bonding. In either event, the sealed cavity could be maintained as a vacuum or could be filled with air, nitrogen, argon, neon, and/or hydrogen gas to improve performance in various specialized applications. Other process embodiments of the invention utilize various circuit features formed during fabrication of an integrated circuit as the bonding material of one of the substrates. Such embodiments effectively substitute integrated circuit structure in place of additional bonding material used in the above-described embodiments.

Device embodiments of the present invention include bonded hybrid structures with MEMS devices of various forms. One bonded hybrid structure embodiment of the invention includes a first substrate having a sensing device with electrical terminals comprising conductive bonding material disposed on the first substrate. The bonded structure also includes a dielectric substrate which is in aligned confronting relation with the first substrate, the dielectric substrate having target features of conductive bonding material which have been thermocompressively bonded to the electrical terminals of the sensing device. The bonded structure also includes a number of wire-bond pads and conductive lines electrically coupling respective terminals of the sensor to the wire bond pads.

One variant on the above-described bonded hybrid structure includes the addition of a bonded hybrid structure with an integrated circuit. The second structure includes a semiconductor substrate with an integrated circuit, conductive bonding features and a dielectric substrate which is in aligned confronting relation with the semiconductor substrate. The dielectric substrate includes conductive target features, wire-bond pads and respective conductive lines electrically coupling the integrated circuit to the wire-bond pads. In this embodiment, the first bonded hybrid structure is electrically coupled to the second bonded hybrid structure via wire-bonds.

In another variant of the embodiment discussed immediately above, the separate first and second dielectric substrates are replaced with a single dielectric substrate, the wire-bond pads are preferably eliminated from this embodiment and the conductive lines are preferably directly connected to the respective thermocompression bonds to electrically couple the sensing device to the integrated circuit.

Another bonded hybrid structure embodiment of the invention includes a first substrate having a sensing device with electrical terminals comprising conductive bonding material disposed thereon. The device also includes a dielectric substrate which is in aligned confronting relation with the first substrate, the dielectric substrate having target features of conductive bonding material which have been thermocompressively bonded to the electrical terminals of the sensing device. The inventive structure also includes a number of wire-bond pads and conductive lines electrically coupling respective sensor terminals to the wire-bond pads. Further, the structure also includes a second substrate with an integrated circuit, this integrated circuit having electrical terminals comprising wire-bond pads. In this embodiment, the hybrid structure having the sensing device is electrically coupled to the integrated circuit of the second substrate via the respective wire-bond pads.

Still another device embodiment of the present invention includes a first substrate having a microelectromechanical device with an electrical terminal comprising conductive bonding material. This embodiment also preferably has a ring of bonding material disposed around the microelectromechanical device and a second substrate which is in aligned confronting relation with the first substrate. The second substrate has an integrated circuit with at least one terminal of conductive bonding material and a target feature of bonding material at least partially corresponding to the ring of material surrounding the microeletromechanical device. The first and second substrates are thermocompressively bonded together such that a sealed cavity encloses the microelectromechanical device and the respective terminals of that device and the integrated circuit are electrically coupled to one another via the bonding material.

The advantages over the related art which are provided by the various embodiments of the present invention are numerous. For example, since the bonding materials used with the invention can be much thicker than the thin films used in conventional wafer-bonding, they can deform plastically over surface topography variations, particle contaminates and surface irregularities. Thus, the present invention offers the advantage of providing sealing bonds, including bonds with electrical connections leading in and out of a sealed cavity containing a MEMS, despite the presence of rough surface topography, imperfections, etc.

Moreover, the thermocompression bonding techniques of the present invention can achieve a bond-strength which is up to four times greater than the bulk tensile strength of gold. The bond-strength provided by the invention is also higher than those achieved with bonding techniques of the related art such as thermosonic wire bonding. Significantly, this high bond-strength is sufficient to allow a bonded pair of wafers to be diced on a standard dicing saw without delamination. This, in turn, permits singulation of chips after bonding, so that the present invention can be used to achieve significant cost reductions and increased efficiencies which were previously only theoretically achievable.

Another significant advance offered by the present invention is that the bonds formed with the invention can also be used to form electrical interconnections with a MEMS chip without any additional materials or process steps. This is accomplished, for example, by laying out small conductive features of bonding material to serve as electrical contacts between the MEMS substrate and integrated circuits in the lid substrate and then bonding the chips together.

Still another advantage of the invention is that electrical interconnections formed with the invention can be made very small. This yields both a real estate savings and a concomitant reduction in parasitic capacitance. Reduced parasitics, in turn, directly translate into improved sensor performance.

Moreover, the electrical interconnections of the present invention are small enough that they eliminate the need for co-fabricated circuits. A two-chip approach is enabled, which allows the sensor structure and the circuitry to be fabricated independently. State-of-the-art foundry IC processes may be used to fabricate the circuitry, rather than low-volume, "boutique" processes and optimal processes (such as high aspect SOI) can be employed for the sensor fabrication. Turnaround time is also much faster in the two-chip approach, since it relies for the most part on existing infrastructure.

Numerous other benefits and advantages of the present invention will become apparent to those of ordinary skill in the art from the detailed description of the invention, from the claims and from the accompanying drawings.

BRIEF DESCRIPTION OF THE DRAWINGS

The preferred embodiments of the present invention will now be described with reference to the accompanying drawings wherein like numerals represent like structures and process steps and wherein:

FIGS. 1a–1b illustrate the formation of chip bonds, despite the presence of particle contaminants, using thermocompression bonding in accordance with one preferred embodiment of the present invention;

FIGS. 2a–2b illustrate the structure and use of an apparatus for thermocompressively bonding substrates in accordance with one preferred embodiment of the present invention;

FIG. 2c illustrates the structure and use of an alternative apparatus for thermocompressively bonding substrated in accordance with another preferred embodiment of the present invention;

FIGS. 3a–3d illustrate thermocompressively bonding a substrate with an IC onto a substrate with a MEMS device in accordance with one preferred embodiment of the present invention, the IC and MEMS being electrically coupled to one another through the bonds themselves and sealed off from the ambient environment by a sealing ring of bonding material;

DETAILED DESCRIPTION OF THE PREFERRED EMBODIMENT

Figure 5A:
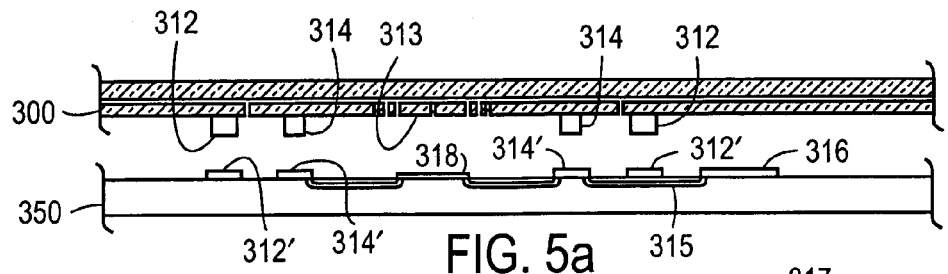
FIGS. 5a–5d are a series of cross-sectional elevation views of two substrates illustrating a process for thermocompressively bonding the two substrates together in accordance with another preferred embodiment of the present invention.

A cross-sectional view of an exemplary pair of substrates 100 in accordance with the invention are shown in FIGS. 1a and 1b, these Figures illustrating structures and principles of the invention applicable throughout the various embodiments of the invention. As shown in FIG. 1a, a first substrate 120 is preferably made of a relatively hard material (such as silicon, silicon dioxide, quartz, pyrex, glass, gallium arsenide or another material known in the art) and bears a plurality of bonding features 160 on an upper surface of substrate 120. These bonding features can assume virtually any desired dimension or shape such as contact bumps, lines and/or sealing rings and are disposed on predetermined locations of substrate 120. For example, the rings can be in the form of a continuous line or wall of substantially uniform thickness and height and may assume an annular (round or elliptical), rectangular, trapezoidal or square shape, etc., as viewed from above.

Further, bonding features 160 may be bonding material disposed on substrate 120 in any one of a large number of ways known in the art (the particular method used will depending on the substrate material selected). Some examples of such known deposition techniques include sputter deposition, evaporation, screen printing and electroplating. For the substrate materials discussed here, bonding features 160 are preferably formed by a three step electroplating process. The first step comprises sputter depositing a thin layer of titanium-tungsten onto substrate 120. Preferably, a second step of sputter depositing a thin layer of gold on top of the titanium-tungsten is also performed. The third step comprises electroplating gold bonding features 160 on top of these deposited layers to a total height of at least about 3 three microns. It will be appreciated that a large number of variant processes could also be used. For example, other materials could be used and/or a fourth layer of electroplated palladium could be added. A large number of possible process material and structural variations of the related art are described in U.S. patent application Ser. No. 60/159,026, which application was filed on Oct. 12, 1999 and is entitled "Fabrication Integration, and Packaging of Microelectromechanical Systems (MEMS) Using Thermocompression." The relevant portions of this application (including all appendices) are hereby incorporated into this specification by reference.

Also as shown in FIG. 1a, a second substrate 140 (made of one of the semiconductor or dielectric materials noted above) preferably bears relatively thin target features 160' (between 0.1 and 1.0 microns in height) on a lower surface, the target features confronting the bonding features of first substrate 120. These thin features are preferably laid out in the form of a number of complementary target features of bonding material. At least some of target features 160' are at least partially complementary in shape and at least partially complementary in location relative to respective features 160 of first substrate 120. While target features 160' may be formed in a large number of conventional ways, they are preferably electroplated in the desired locations in the same general manner as discussed above with respect to features 160.

In order to allow for some degree of misalignment between substrates 120 and 140, target features 160' of second substrate 140 may have greater lateral dimensions than features 160 of first substrate 120. By contrast, features 160 (e.g., the bumps and rings) on substrate 120 may be somewhat thicker, and of lesser lateral dimensions than those on substrate 140, to encourage a greater degree of plastic deformation of features 160. This relationship creates a more reliable bond between the respective features. It will be appreciated, however, that target features 160' could also be relatively thick bonding features like those of substrate 120 if desired. It will also be appreciated that the particular substrates on which the target features and bonding features are disposed is not critical to the invention. Thus, they may, in some circumstances, be reversed.

With primary reference now to FIG. 1b, there is shown a cross-section of a bonded hybrid structure resulting from thermocompressive bonding in accordance with the invention. The bonding shown in FIG. 1b occurs when first and second substrates 120 and 140 have had sufficient heat and pressure evenly distributed along the outer surfaces of the substrates as indicated by arrows 190 of FIG. 1a. As shown in FIG. 1b, the bonding features of bonding material on first substrate 120 have been plastically deformed or compressed by roughly 50% of their original height. If corresponding sealing rings are patterned on the first and second substrates, a sealed cavity bounded by the sealing ring and the first and second substrates is formed during such bonding. (See e.g., bonded sealing ring 312/312' of FIGS. 3a–3c; and sealing ring 634 and cavity 638 of FIG. 6b.) If the bonding material forming the features of first and second substrates 120, 140 is sufficiently conductive, then these bonds also serve to establish electrical connections between one or more devices disposed on the two substrates. One advantage of this technique is that extremely small contacts are possible, reducing parasitic capacitance between the elements of the respective substrates. Parasitic capacitance of an electrical contact disposed on a semiconductive substrate with an insulator disposed therebetween increases with the contact surface area. Standard wire-bond contact pads, normally have an area of roughly 10,000 square microns. Since the contacts of the present invention are roughly 100 square microns after bonding, there is a 100-fold reduction in the parasitic capacitance of each electrical contact. However, it should be noted that even a small reduction in pad area can lead to a significant reduction in parasitics. For example, a reduction in the lateral dimensions of only 30% will reduce the parasitic capacitance of a circuit by 50%.

Also as shown in FIG. 1b, use of the present invention can greatly increase manufacturing yields by minimizing the effect that contaminants have on the formation of bonded hybrid structures. Substrates 120 and 140 are shown in FIGS. 1a and 1b as having particle contaminants 180 trapped therebetween as is expected due to a measure of contaminants that are inherently present in the processing of such components. While particulate contaminants 180 are too large to be ignored by some bonding methods of the related art, they are typically too small to significantly impact the various methods, apparatus and structures of the present invention. Thus, in the case of one of the contaminants of FIG. 1b, the bonded pair of substrates simply straddles the particle. In the case of the other particle, it is simply trapped within one of the bonded contacts, the bonding material being plastically deformed to a sufficient degree that the particle is trapped between the bonded features. Moreover, while a single particle of a larger dimension than is shown may affect one or two immediately adjacent contacts, the thickness and plasticity of the bond structures prevents extensive defects or voids from forming. Thus, improved yields may be expected from the inventive thermocompression bonding process even when larger particle contaminants are present.

These principles also enable the invention to successfully bond substrates having surface variations such as bow (or warpage) and/or topographical variations. Thus, by using bonding features of at least three microns in height, the invention can successfully bond substrates having a bow of at least about five microns, topography variations of up to 2.5 microns in height and/or particulate contaminants of up to 2.5 microns in height.

With reference now to FIGS. 2a and 2b, there is shown an apparatus 200 for performing die-scale (or chip-scale) thermocompression bonding on a substrate pair 270, each substrate being about one square centimeter in area. The substrate pair 270 is bonded by apparatus 200 and comprises a pair of substrates of the nature discussed above with respect to FIGS. 1a and 1b. As shown, apparatus 200 preferably comprises two substantially rigid and at least substantially parallel beams 220 and 240, a fastening mechanism 280 operatively associated with the beams at opposite ends thereof, a force-transferring anvil 260 and a pressure and heat delivering apparatus (implicitly present in FIGS. 2a and 2b) for delivering appropriate heat and compressive force to anvil 260 during bonding of substrate pairs 270. As shown, spacers 272 can be used to simplify insertion and removal of substrate pair 270 by establishing a gap between beams 220 and 240. While upper beam 220 is rendered somewhat resilient by the narrowed sections near the middle portion thereof, lower beam 240 is significantly more rigid. Additionally, beam 220 is much more resilient in the vertical direction than in either of the orthogonal (lateral) directions. This allows a high degree of compression to be applied to the substrates 270 being bonded while substantially entirely preventing lateral motion which might otherwise result in misalignment. The necessary heat can be provided by placing apparatus 200 in an oven or by other suitable means known in the art. The appropriate pressure can be supplied by an arbor press or by other suitable means known in the art.

An alternative apparatus for thermocompressively bonding substrates in accordance with the invention is shown in FIG. 2c. As shown, apparatus 290 comprises opposing first and second billets 292 and 292' having respective first and second resilient lips 294 and 294', a fastening mechanism 296 (with spacers 298) operatively associated with lips 294 and 294' and a pressure and heat delivery apparatus (implicitly present in FIG. 2c) for delivering appropriate heat and compressive force to apparatus 290 during bonding of wafer/substrate pairs 270'. The primary differences between apparatus 200 and 290 are that (1) apparatus 290 is sized and shaped to most efficiently perform wafer-scale-bonding, and (2) fastening mechanism 296/298 preferably includes 2–4 bolt/nut assemblies with spacers instead of two assemblies as in apparatus 200. Therefore, those of ordinary skill will readily understand the operation of apparatus 290 in light of this discussion, FIG. 2c and the discussion of apparatus 200 above.

Still another alternative for supplying the necessary pressure and heat is to place a substrate pair into a high-temperature bag (made of a material such as polyimide or metal foil) and subject it to hot-isostatic-pressing.

Figure 3D:
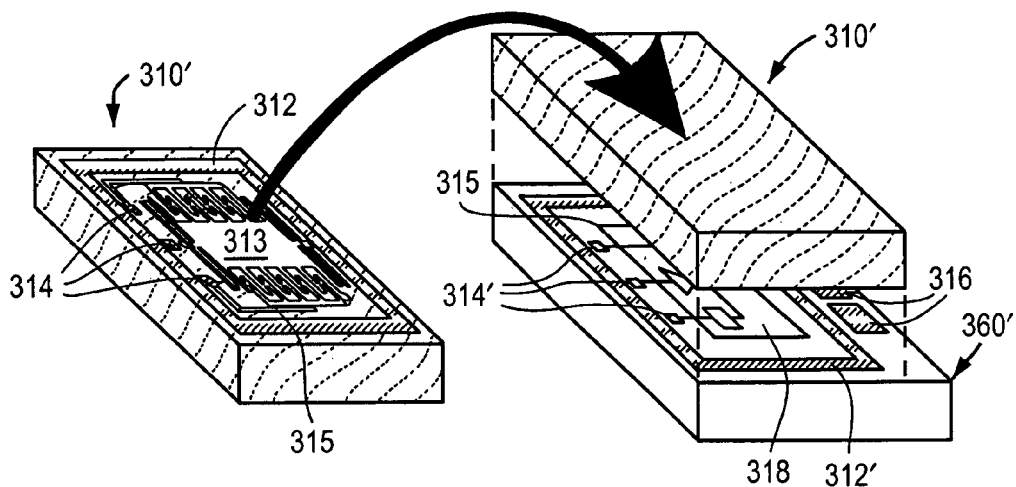

Bonded hybrid structures and a wafer-scale process for thermocompressively bonding one wafer to another is shown in FIGS. 3a–3d. In particular, a substrate 300 that comprises a previously fabricated MEMS wafer with the dimensions of a standard sized semiconductor wafer and plural instances of a given MEMS die 310 is shown in FIG. 3a. This substrate is preferably made of a hard substrate material such as silicon, silicon dioxide or another ceramic as described above. Other examples of suitable substrate materials are well known in the art and include gallium-arsenide, glass, silicon-carbide and $Al_2O_3$.

One particular instance 310' of a MEMS die has been illustrated in plan view and magnified to reveal the structure of a MEMS device 313 contained thereon. Also shown are a sealing ring 312 of bonding material surrounding MEMS 313, plural bump-like features 314 of bonding material which form electrical contacts of MEMS 313 and conductive lines 315 electrically coupling various components together. While the particular MEMS device shown in FIG. 3a is an accelerometer, those of ordinary skill will readily appreciate that MEMS device 313 could be any one of the MEMS devices known in the art. Examples of such MEMS devices include pressure transducers, acoustic wave devices, micro-mirrors, tunable capacitors, optical switches, antennas, mechanical resonators, micro-relays, inertial sensors, etc.

Insofar as the present invention preferably avoids the need to use special fabrication techniques to create the desired MEMS device, MEMS wafer 300 of FIG. 3a is preferably manufactured in accordance with conventional MEMS wafer fabrication processes with the exception that the processes of the present invention are then used to dispose target features 312 and 314 onto wafer 300. It will also be appreciated that a large number of MEMS devices may be fabricated within the area of MEMS wafer 300, in part, because of the minimal real estate occupied by target features 312 and 314. In particular, it will be noted that the wall thickness of ring-like target feature 312 (as measured at least generally parallel to the surface of wafer 300 and at least generally perpendicular to the ring-wall at any given point) is preferably between about five and ten microns. Most preferably, target feature 312 has a uniform wall thickness of about 10 microns, which is about $1/10^{th}$ to $1/20^{th}$ the wall thickness of glass frit rings of the related art. Square and rectangular rings in the range of 100–200 microns on each side have been satisfactorily formed on chips to date.

Bump-like target features 314 are each preferably between about 9 and 100 square microns in surface area. Most preferably, bump-like target features 314 each have a surface area of about 100 square microns which is about $1/100^{th}$ to $1/200^{th}$ of the surface area of conventional wire-bond pads. In the limit, bump-like features approaching 10,000 square microns may be possible subject to various other constraints discussed herein. While the target features of wafer 300 are all preferably about 1 micron in height, they could be anywhere between about 0.1 and about 20 microns in height (depending on the hardness of the bonding material) as measured at least generally perpendicular to the surface of wafer 300. For applications demanding minimal contact area, bump-like features as small as 9 square microns can be used. However, when accurate alignment is not possible, it may be necessary to use larger features. In such case, the bonding features of the first substrate would preferably remain a standard size and those in the second would be expanded.

Metals such as aluminum, gold, platinum, palladium, and copper are suitable bonding materials for target features 312 and 314 with gold being the most preferred. However, non-metals such as ceramics, including silicon and silicon dioxide, can also be used for the target feature bonding material in certain circumstances; for example, where the bonding material for the bonding feature is gold.

A robust barrier/adhesion layer is preferably disposed as an intermediate interface between target features 312 and 314 and substrate 300. For example, 0.1 microns of sputtered titanium-tungsten (TiW) is typically desirable to prevent interdiffusion between the substrate and the target features; This is particularly useful when the selected bonding material is gold and the selected substrate material is silicon because this combination of materials (1) is high-temperature tolerant, (2) resists damage from exposure to hydrofluoric acid, and (3) can be wet-etched. These features are desirable (1) because dry etching is often overly complicated (if not impossible) to use with MEMS having a severe topography, (2) because the use of wet etching avoids the need to perform certain steps (such as trench fill) relative to dry etching, and (3) because a lengthy hydrofluoric etching step is part of many MEMS fabrication processes. While TiW is the most preferred material for a barrier/adhesion layer, other materials are compatible with hydrofluoric acid etching and, thus, could be used with the invention. Such materials include tungsten-silicide and most of the refractory metals.

If gold is used as the bonding material, it may be electroplated onto a seed layer of gold which has been sputtered onto a layer of TiW. Such electroplating is preferably performed by immersing a particular wafer into a bath of sulfite-based electroplating solution; the most preferred bath is TECHNIC brand sulfite electroplating solution designated by Product Number TG-25E. After plating, unused seed layer areas can be stripped in a wet etch, as discussed above. Before the wet etch, it is helpful to anneal the film for 60 seconds at 150 degrees Celsius, using a hotplate or similar apparatus. This reduces undercutting during the wet etch. Additionally, it is desirable to de-gas gold features which have been electroplated. Annealing at 300 degrees Celsius either in a vacuum or in the presence of a gas such as nitrogen, argon, neon or hydrogen for several hours can reduce the hardness of the gold by a factor of three, thus enabling bonding at lower pressure levels during a subsequent bonding operation.

An integrated semiconductor circuit wafer 350 to be bonded to MEMS wafer 300 in accordance with the present invention is shown in FIG. 3*b*. In particular, substrate 350 comprises a semiconductor wafer with standard dimensions, plural instances 360 of a given integrated circuit 360' and a pattern of bonding features. The bonding features are preferably contact bumps and/or sealing rings, which are at least substantially complementary in shape and in location to the features of substrate 300. In some embodiments of the invention the target features of substrate 300 are slightly wider than the features of the second substrate 350 to accommodate possible misalignment between the two substrates.

One particular instance 360' of the integrated circuits die 360 has been illustrated in plan view and magnified in FIG. 3*b* to reveal the structure of the integrated circuit 318 (shown here in partial schematic form). As shown, IC die 360' forms a lid chip which can provide hermetic or vacuum sealing and electrical interconnect with MEMS device 310. Lid chip 360 preferably, but not necessarily, incorporates integrated circuit 318. Thus, lid chip 360' may be fabricated on a silicon substrate or may simply be a dielectric material such as glass.

Integrated circuit die 360' may contain a wide variety of conventional circuitry 318 such as a capacitive readout circuit, an amplifying circuit or a buffering circuit, etc. for amplifying the voltage, current, impedance, frequency, or other output of the MEMS sensor. In a more general sense, IC 360' may provide any circuitry for converting the MEMS output to a more usable form. The integrated circuit die 360' also preferably includes plural conductive lines 315 electrically coupling various components and conventional wire-bond pads 316. Standard wire-bonds may be formed at pads 316 for the purpose of packaging the bonded hybrid structure (see FIG. 3*c*) in one of the many conventional low-cost semiconductor packages known in the art. The processes of the present invention do not require the use of special processes to fabricate integrated circuit 360' beyond the formation of the inventive seals, bumps, etc., described herein. Thus, with this exception, circuit 318 may be fabricated at a conventional commercial foundry using standard IC fabrication processes such as CMOS, gallium arsenide, silicon germanium, etc.

It will also be appreciated that a large number of integrated circuits 360 may be fabricated within the area of semiconductor wafer 350 because of the minimal real estate occupied by sealing ring 312'. In particular, it will be noted that the wall thickness of sealing ring 312' (as measured at least generally parallel to the plane of wafer 350 and at least generally perpendicular to the wall at any given point) is preferably between about five and ten microns. Most preferably, sealing ring 312' has a wall thickness of about ten microns.

Similarly, bumps 314' are each preferably between about 9 and 100 microns squared in surface area. Most preferably, bumps 314' each have a surface area of about 100 square microns. In the limit, bumps approaching 10,000 square microns may be possibly subject to various other constraints discussed herein. For applications demanding minimal contact area, bumps as small as 9 square microns can be used. However, when accurate alignment is not possible, it may be necessary to use larger features in the manner described above.

Bonding features 312' and 314' of the second substrate 350 are preferably formed of gold because gold forms less of an oxide on its surface than many other metals and because it is relatively malleable. As shown in FIG. 3*b*, these bonding features are patterned to form contact bumps, conductive lines, and/or seal rings. Plastic deformation (largely compression) of the bonding features is desired for good bonding. Compression causes "pancaking," (See e.g., FIGS. 1*b* and 6*b*) which exposes fresh surface and promotes thermocompression bonding. Preferably, the height of bonding features 312' and 314' is twice the height of any surface asperities. Within these constraints, it is desirable to employ the minimum possible thickness, since this provides the best lateral resolution in patterning. Thus, the height of these bonding features is preferably between about 3 to 6 microns with the minimum height being dictated by the chip topography variations, particulate contaminates and other surface irregularities on a typical IC wafer. Since the topography, particulates, and other surface irregularities are generally in the range of 1–2 microns, a preferred height of 3 to 6 microns is sufficient to prevent these factors from unduly interfering with bonding even with the desired compression of the bonding materials. Also, the bonding features of second substrate 350 are preferably thicker than and at least as soft as those of the first substrate 300. Otherwise, the bumps and rings of second substrate 350 will tend to overly indent the features of the first which diminishes bond quality.

If gold is used as the bonding material, it is preferably electroplated onto a seed layer of gold which has been sputtered onto a layer of TiW. After plating, unused seed layer areas can be stripped in a wet etch, as discussed above. Before the wet etch, it is helpful to anneal the film for 60 seconds at 150 degrees Celsius, using a hotplate or similar apparatus. This reduces undercutting during the wet etch. Additionally, it is desirable to de-gas gold features which have been electroplated. Annealing at 300 degrees Celsius for several hours can reduce the hardness of the gold by a factor of three, thus enabling bonding at lower pressure levels during a subsequent bonding step.

Palladium may also be used as the bonding material, either alone or as a palladium coating on another metal. Palladium is known to bond to silicon dioxide surfaces, and has the ability to reduce surface oxides. Palladium may be used in combination with germanium for low-temperature wafer bonding. Finally, indium, copper, and several other metals may also be employed as the bonding material as known in the art.

If the target features are formed of aluminum, care should be taken to minimize the time spent at elevated temperature during the thermocompression bonding step. Excessive time at elevated temperatures leads to excessive alloying of the aluminum if it is bonded to gold. Since, in an extreme case, target features made of aluminum may be completely consumed during thermocompression, a practical upper limit of time and temperature for thermocompression bonding is roughly 30 seconds at 300 degrees Celsius. When a gold-to-gold bond is formed with an appropriate barrier layer, such as TiW, this time constraint can be increased to at least 10–20 minutes at 300 degrees Celsius without ill effect.

In one variant of the embodiment of FIGS. 3a–3d, features 312' and 314' are not separately disposed on die 360'. Rather the invention encompasses embodiments in which these features are the top-level metal of the integrated circuit 318 itself and features 312 and 314 of die 310' can be thermocompressively bonded directly onto the integrated circuit.

As shown in FIGS. 3c–3d and in accordance with one preferred embodiment of the present invention, the IC and MEMS wafers are preferably placed in aligned confronting relation, electrically coupled to one another via the thermocompression bonds formed by contacts 312/312' and sealed off from the ambient environment via the thermocompression bonds formed by sealing rings 314/314'. Thus, in the device shown in FIGS. 3c–3d, the IC die forms the lid of the MEMS die thereby protecting the MEMS device from contamination in the future (for example during subsequent singulation and packaging of the device).

It will be appreciated that the thermocompression bonding of FIGS. 3a–3d occurs on a wafer-scale, as opposed to the die-scale bonding discussed with reference to FIGS. 2a and 2b. Thus, in this embodiment of the invention, wafers 300 and 350 are first placed in aligned confronting orientation and then urged against one another with sufficient pressure and at a sufficiently high temperature to cause plastic deformation of all of the bonding features simultaneously. A marked increase in manufacturing efficiency is achieved using such a wafer-scale bonding process because the high density of connections afforded by the inventive process allows the sensor design to take advantage of the metal wiring layers on the circuit substrate. Additionally, the circuit substrate also doubles as a protective lid.

This process is described more fully immediately below with joint reference to FIGS. 4 and 5a–5b. While FIG. 4 illustrates a process for thermocompressively bonding semiconductor substrates to one another in accordance with one preferred embodiment of the present invention, FIGS. 5a–5d show cross-sectional elevation views of two substrates being thermocompressively bonded together in accordance with the process embodiment of FIG. 4.

Figure 4:
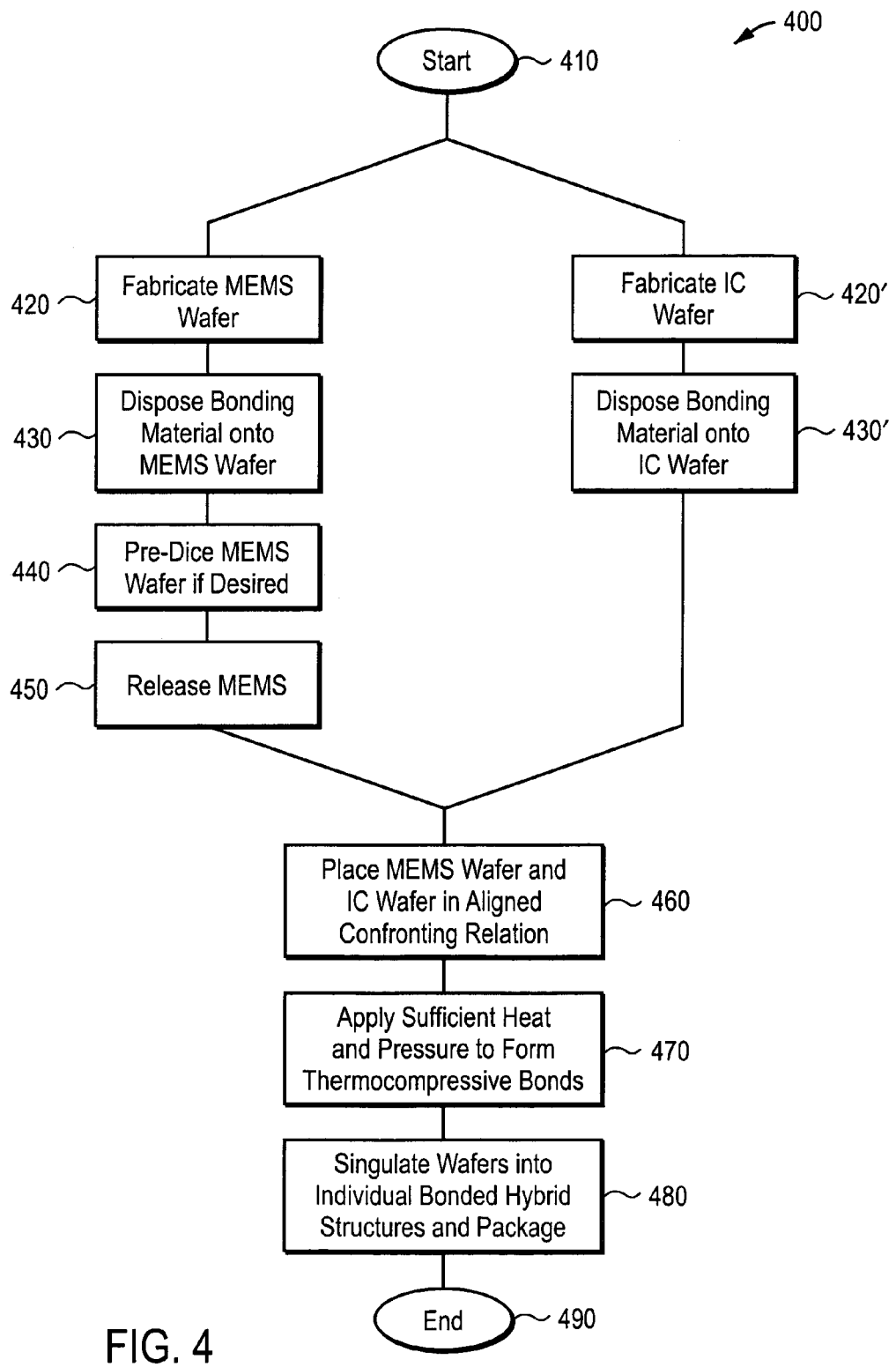
FIG. 4 illustrates a process for thermocompressively bonding two wafers to one another and singulating the resulting bonded hybrid structures in accordance with a preferred process embodiment of the present invention.

As shown in FIG. 4, the bonding process 400 begins at block 410 and proceeds to block 420 and 420' where a MEMS wafer and an IC wafer (with wire-bond pads) are fabricated using any desired fabrication process. Then the process advances to block 430 and 430' where bonding material is disposed onto the MEMS and IC wafers in accordance with the invention and as fully described herein. If desired, the MEMS wafer can undergo an optional pre-dice operation 440 wherein grooves are cut into predetermined locations on the MEMS wafer. The predetermined locations correspond to the locations of the wire-bond pads of the IC wafer. The process then advances to block 450 where the MEMS wafer preferably undergoes an etch process to release the movable member(s) of the MEMS device from the MEMS substrate. Once preparation of the individual wafers has been completed the wafers are placed in aligned confronting relation with one another at block 460. Various commercial aligning tools are available (e.g., from Karl Suss, Electronic Visions, Research Devices, etc.).

After alignment, the process passes to block 470 where the substrates are compressed together and heated in such a way as to form thermocompression bonds between them. The substrates should preferably be heated to a temperature of 300 degrees Celsius. A pressure of at least 30,000 pounds per square inch of congruent bonding area is applied. For a typical 6" wafer with 5% bond area coverage, this amounts to 40,000 lbs. of force. The total congruent bonded area should preferably be in the range of 2–7.5% of the substrate area. Less bonding area may lead to insufficient bond strength such that this bond may fail during singulation. More bond area will necessitate excessive bond force, which may damage the substrates. Additionally, adequate space should be provided between the various features to allow for "pancaking" (lateral spreading). As a rule of thumb, bumps can be expected to spread by as much as a factor of two. The bonded wafers can then be singulated at block 480 and the process terminates at block 490.

Figure 5B:
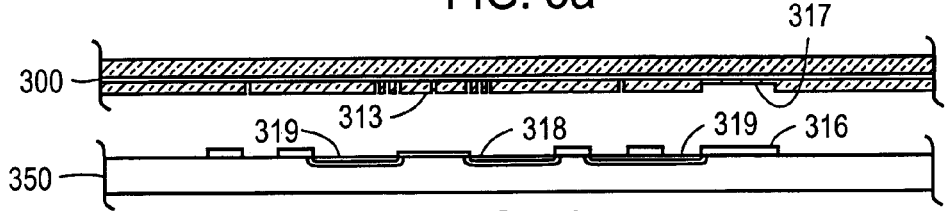
Figure 5C:
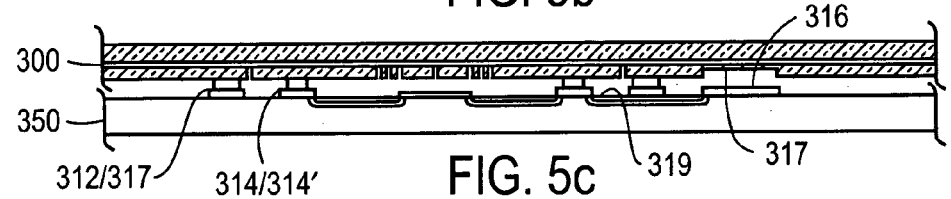
Figure 5D:
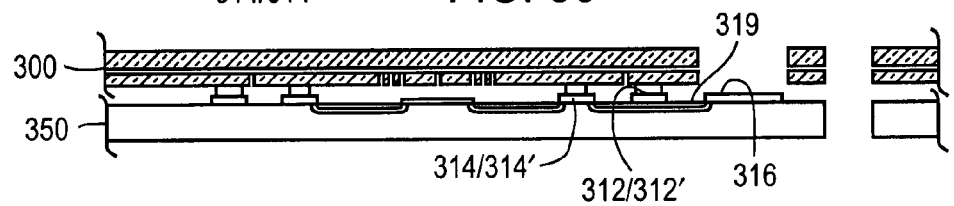

With primary reference now to FIGS. 5a–5d, a MEMS substrate is pictured above a circuit substrate ("CMOS substrate") in each step and the various components have been numbered consistent with FIGS. 3a–3d. The MEMS structures 313 may be fabricated on a SOI (silicon-on-insulator) wafer, or using any of a number of other materials or techniques as appropriate to the situation. As shown in FIG. 5b, the MEMS substrate may be pre-diced partially through its thickness to form channel 317. The pre-dicing is preferably performed at areas which will overlie the wire-bond pads 316 of the circuit substrate after bonding. After this optional pre-dice step, the release etch is performed on the MEMS substrate (see FIG. 4) to free the movable elements of the MEMS structures. The substrates are then bonded by application of heat and pressure, i.e. using thermocompression bonding (see FIG. 5c). This bonding step preferably leaves each MEMS device in an individually sealed cavity (see FIG. 5c) bonded by sealing ring 312 and wafers 310' and substrates 300 and 350. A final dicing is then performed to expose the circuit wafer bond pads (by cutting down to meet the cavity formed in the pre-dicing step) and to singulate the bonded wafer pair into individual bonded hybrid structures. Standard dicing saws are capable of maintaining very tight vertical tolerances (less than five microns), so there is no danger of accidentally cutting into the bond pads during this step. The actual allowable vertical tolerance would be on the order of 200 microns during this step.

An advantage of the embodiments of FIGS. 3a–5d is that the released sensor structures are already pre-packaged when the singulation step is performed. Without the protection of the IC substrate, the fragile structures would be destroyed by the water and particulates encountered during singulation. In the final structure, electrical signals pass from the sense element on the MEMS wafer, to the MEMS wafer contact bump, the circuit wafer contact bump, through the electrical interconnects patterned on the circuit wafer and into the input of the electronic circuit where the signals are amplified by the electronic circuit. The amplified signals are then coupled out under the seal ring, using the electrical interconnect and inter-metal dielectric layers 319 of the circuit wafer. Standard, commercially available CMOS processes offer a number of layers of metal and insulating material 319 (inter-metal dielectric) that can be utilized for this purpose. Finally, the amplified signals are coupled to one or more of the wire-bond pads from which they may be transmitted off-chip.

Figure 6A:
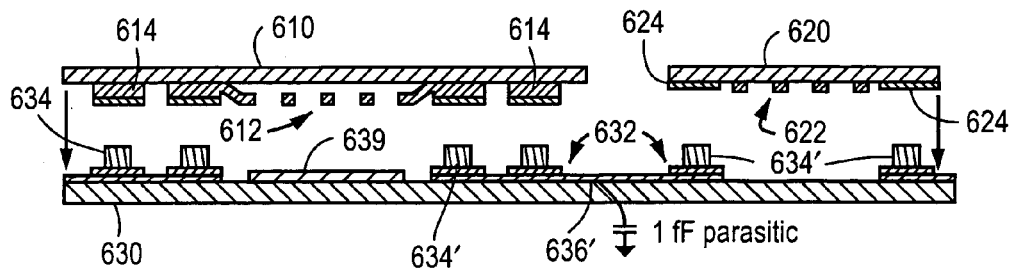
FIGS. 6a–6b are cross-sectional elevation views illustrating the thermocompressive bonding of a MEMS substrate and an IC substrate to a common dielectric substrate to form a bonded hybrid structure in accordance with still another preferred embodiment of the present invention.
Figure 6B:
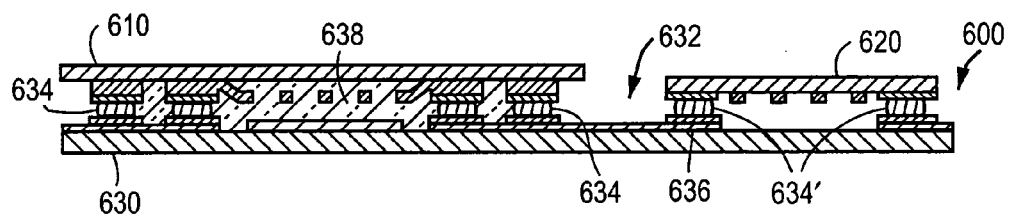
Figure 6C:
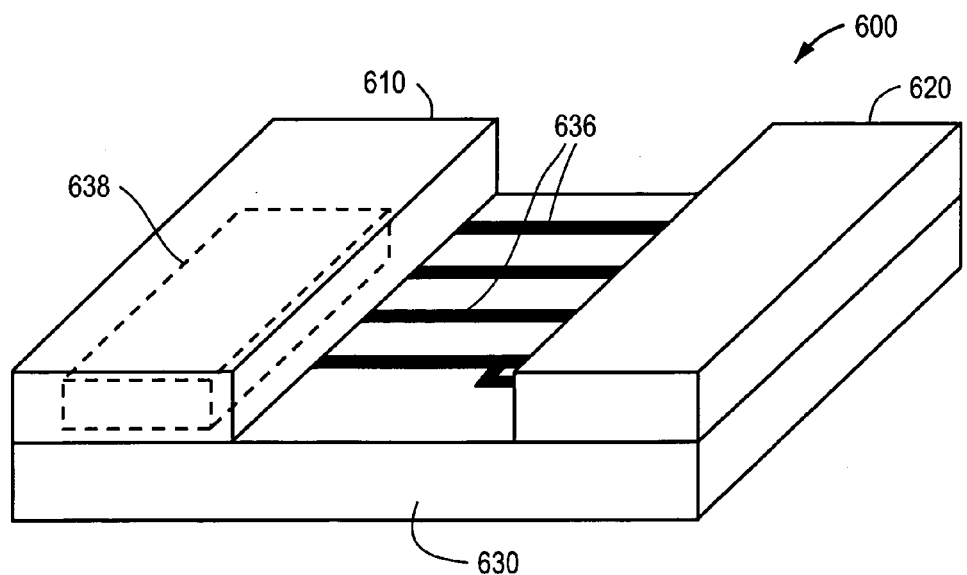
FIG. 6c is an isometric view of the bonded hybrid structure resulting from the thermocompressive bonding process illustrated in FIGS. 6a–6b.

FIGS. 6a–6c show another alternative bonded hybrid structure embodiment of the present invention, in this case a bonded hybrid structure 600. In this embodiment, a MEMS substrate 610 and an IC substrate 620 are bonded to opposite ends of a single dielectric interconnect substrate 630, or "bridge." As shown, the substrate 610 is fabricated with target features 614 for the MEMS chip for bonding with a sealing ring 634 for hermetic or vacuum sealing of a cavity 638. Electronically coupling bonds 634' are run along conductive lines 636, out through the seal ring 634 (which is insulated by dielectric 632), over to one or more electrically coupling bonds 634' near the edge of integrated circuit 622. This structure provides many of the advantages of directly bonding the two substrates to one another. For example, the parasitic capacitance and resistance can be nearly as low. However, this configuration permits re-routing of connections, so that a pre-existing IC device may be connected to a newly-designed sensor or other device. Another notable advantage of this embodiment is that bonding can be performed without wasting space—i.e. there is no need to leave open sites on the MEMS substrate for placing CMOS dice of a larger size. Another feature of this embodiment the use of a getter 639 disposed on dielectric substrate 630 ensure a high quality vacuum seal. Getter 639 can be any conventional getter known in the art and its use here is, in part, made possible by the use of dielectric substrate 630 (as opposed to an IC).

An isometric view of bonded hybrid structure 600 (a MEMS substrate 610 and a circuit substrate 620 bonded to a single dielectric substrate 630) is shown in FIG. 6c. The dielectric substrate 630 may be at least substantially transparent, which simplifies alignment and enables light-detecting sensors, such as a diode detector, to sense light even if the detector is sealed within a cavity (in this case cavity 638).

Figure 7A:
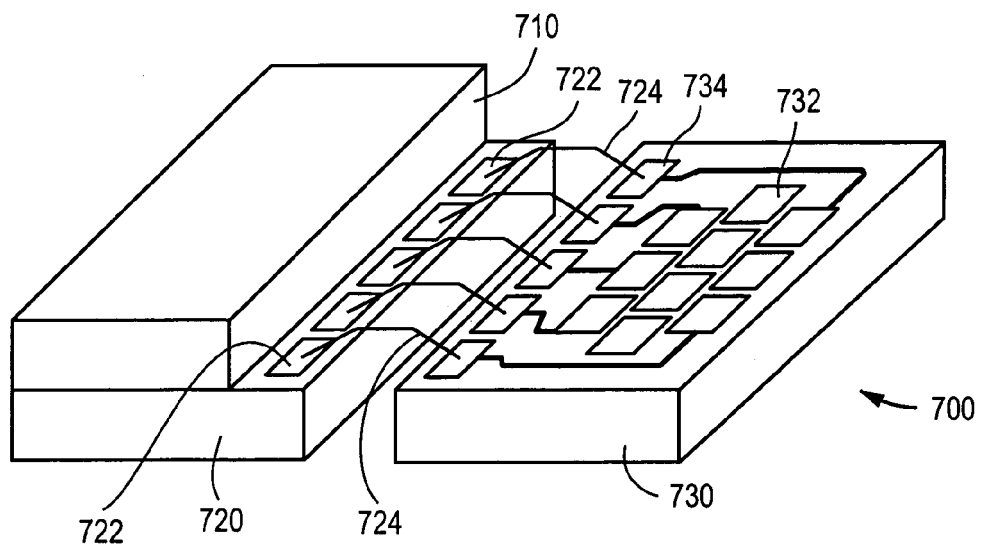
FIG. 7a is an isometric view of a MEMS chip thermocompressively bonded to a dielectric substrate wherein the resulting hybrid structure is electrically coupled to an IC semiconductor die via wire-bonds, this combination of structures being in accordance with yet another preferred embodiment of the present invention.
Figure 7B:
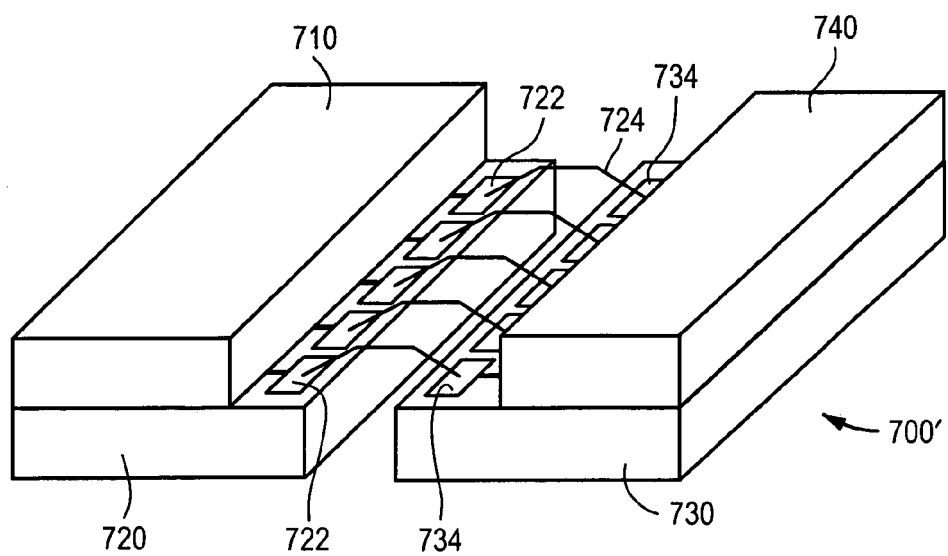
FIG. 7b is an isometric view of a first bonded hybrid structure having a MEMS device electrically coupled to a second bonded hybrid structure having an IC, the combination of structures being electrically coupled with one another and being in accordance with an additional preferred embodiment of the present invention.

Alternative structurally-segregated designs 700 and 700' shown in FIGS. 7a and 7b. Such structurally-segregated sensor designs are beneficial for MEMS gyroscopes because gyroscopes require sensitive, fairly complex circuitry and are felt to require high-aspect sensor structures. One type of circuit element which is useful for gyroscopes is non-volatile memory. This requires extra process steps, but is widely available in commercial IC processes. However, non-volatile memory is generally not available in "boutique" (monolithic) sensor/IC processes.

As shown in FIG. 7a, electrical connections can be carried off of the bonded hybrid structure 710/720 through conventional wire-bonds 724. A MEMS device packaged in this way might be connected to a segregated CMOS circuit 732 disposed on a non-bonded, single-substrate 730, e.g. in the case of a gyroscope, accelerometer, resonant beam device, or RF device. However, to preserve the low-parasitic qualities of the interconnect, the connection length should be minimized. This construction is useful where a high-resistivity substrate is used, such as bipolar silicon or gallium-arsenide, because parasitic capacitance is less of a concern on the circuit substrate and a lid substrate need not be bonded to the circuit die. As an alternative, the connections could be brought onto the CMOS die using a similar type of lid substrate. This would avoid bond-pad parasitics. Such a lidded MEMS/lidded CMOS configuration is shown in FIG. 7b.

FIG. 7b shows another structurally segregated design 700', this embodiment being a variant of the embodiment shown in FIG. 7a. In particular, FIG. 7b shows a MEMS substrate 710 thermocompressively bonded on top of dielectric substrate 720, and IC substrate 740 thermocompressively bonded onto a similar dielectric substrate 730. Although physically segregated, the two dielectric substrates are electrically coupled using wire bonds 722, 724, 734. As shown, substrate 720 allows signals to be routed off substrate 720 without the large (0.5–1 pF) parasitic capacitance associated with a conventional wire-bond pad. Similarly substrate 730 eliminates the corresponding wire-bond pad parasitic capacitance that would be encountered when bringing signals onto conventional low-resistivity CMOS substrate. The connections from substrate 730 to CMOS substrate 740 are preferably made with gold thermocompression bonds in accordance with the invention as described above. The small size of these contacts makes their parasitic capacitance very small. For the same reason, bonding feature contacts in accordance with the invention are used between MEMS substrate 710 and dielectric substrate 720. Electrical signals are brought from the sense element by way of bonding features on sensor substrate 710, to target features on dielectric substrate 720 and then through conductive lines on substrate 720 to wire-bond pads 722.

The above-described embodiments of FIGS. 6a–7b are particularly well suited for vacuum-packaged MEMS, since a dielectric (glass or quartz) substrate can withstand a higher temperature than a CMOS die, were the latter used as a lid or package. The higher temperature capability is desirable for bake-out and getter activation.

The glass substrate bonded hybrid structures of FIGS. 6a–7b may also be desirable for RF MEMS devices, such as mixers, filters, switches, phase shifters, or similar devices. This is because the glass substrate allows good control of parasitics and the compliant seal allows relatively thick signal feed-throughs to be passed in and out of the seal ring. The thickness of these feed-throughs can easily be as much as 0.5 microns, or even 1 microns or more. In addition, the sealing ring is very narrow compared to existing technologies—as little as 5–10 microns. As a result, the interconnect length can be reduced, and there is less electrical coupling to the seal ring and other nearby conductors.

Depending on the constraints of the situation, other embodiments of the present invention may be preferable. For example, it may not be possible in all cases to form gold features as small as 5–6 microns. Nonetheless, advantages associated with low parasitic interconnections are preserved even with bonding features up to 30 or 50 microns in lateral dimensions.

In addition, the aspect ratio of the bumps and seal rings need not be exactly 1:1. It is possible to make the bumps slightly taller, e.g. in a 2:1 height: width ratio, or flatter, e.g. in a 1:2 ratio. Much flatter proportions are even possible, if a sharp corner, edge, or other feature is present which can deform the bonding material. Important characteristics for the bonding features include (1) sufficient thickness to compensate for surface irregularities across the wafer, and (2) means for compressing or deforming at least some small area of the surface.

In addition, the bonding material need not be gold, since other metals (such as those discussed herein) are known to thermocompressively bond. Preferably, the bonding features should be formed of a relatively soft metal, such as gold, aluminum, copper, tin, or lead, or some alloy thereof (e.g. gold-tin). For improved surface characteristics, such a metal might also be coated with gold or palladium.

In some cases, it may be desirable to etch or partially saw the surface of one of the wafers before bonding. The etched area should overlie the wire bonding pads of the other wafer when the two are bonded. This technique allows bonded hybrid structures to be diced in a manner that allows access to the bond pads.

In certain embodiments it may be preferable to employ a long line or "finger" in the bonding feature of the first substrate, positioned to intersect a similar finger at right angles, patterned on the second substrate. This design can drastically reduce contact area, but still allows for the possibility of misalignment. For reducing the effective feature size still further, it may be desirable to deposit metal over an existing mesa or other feature defined in an underlying layer.

While the present invention has been described in connection with what is presently considered to be the most practical and preferred embodiments, it is to be understood that the invention is not strictly limited to the expressly disclosed embodiments, but is intended to cover all of the various modifications and equivalent arrangements included within the spirit and scope of the appended claims.

What is claimed is:

1. A bonded hybrid structure, comprising:
a first substrate;
a sensing device disposed on the first substrate and having at least one electrical terminal comprising a bump of conductive bonding material;
a second substrate;
an integrated circuit disposed on the second substrate, and having at least one terminal comprising a bump of conductive bonding material;
a dielectric substrate in aligned confronting relation to the first and second substrates;
plural target features of conductive bonding material disposed on the dielectric substrate, at least partially congruent with the bumps of the first and second substrates;
the first and second substrates being bonded to the dielectric substrate such that the plural bumps are bonded and electrically coupled to respective ones of the target features; and
plural conductive lines disposed on the dielectric substrate and extending from the target features bonded to the bumps of the first substrate to respective ones of the target features bonded to the bumps of the second substrate to thereby electrically couple the sensing to the integrated circuit.

2. The bonded hybrid structure of claim 1, wherein at least one of the plural target features of conductive bonding material has a minimum height of about 2 microns.

3. The bonded hybrid structure of claim 2, wherein at least one of the plural target features of conductive bonding material has a minimum height of about 2 microns after bonding.

4. The bonded hybrid structure of claim 1, wherein said bonded hybrid structure comprises a device selected from the list of:
RF MEMS, RF MEMS switch, RF MEMS phase shifter, RF MEMS mixer, RF MEMS filter, micromirrors, accelerometer, gyroscope, pressure sensor, tunable capacitor, resonator, acoustic wave device, micro-relay, and inertial sensor.

5. The bonded hybrid structure of claim 1,
wherein said bonded hybrid structure comprises one of an RF MEMS switch and a micro-relay;
wherein said sensing device on said first substrate contains at least one mechanical component of said bonded hybrid structure, and
wherein said second substrate contains at least one portion of an electrical circuit of said bonded hybrid structure.

6. The bonded hybrid structure of claim 1 wherein the first substrate comprises a silicon-on-insulator substrate.

7. The bonded hybrid structure of claim 1 wherein the sensing device comprises a high aspect silicon-on-insulator structure.

8. The bonded hybrid structure of claim 1 wherein the sensing device comprises at least one silicon layer.

9. A sensor comprising:
a first substrate;
a microelectromechanical device disposed on the first substrate and having at least one electrical terminal comprising one or more bumps of conductive bonding material;
a second substrate which is in aligned confronting relation to the first substrate;
an integrated circuit disposed on the second substrate, the integrated circuit having at least one terminal;
one or more target features of conductive bonding material disposed on the second substrate, the target features being at least partially congruent and in electrical contact with the bumps of the first substrate;
the first and second substrates being bonded together in aligned confronting relation such that the bumps are bonded to respective ones of the target features to thereby electrically couple the microelectromechanical device and the integrated circuit.

10. The sensor of claim 9 wherein
the microelectromechanical device is an inertial sensor comprising a mass flexurally suspended from the first substrate and having terminals capacitively coupled to the mass such that the capacitance between the terminals and the mass varies as the mass is displaced; and the integrated circuit is a capacitive readout circuit, the first and second substrates being bonded such that the respective bumps and target features electrically couple the inertial sensor and the capacitive readout circuit.

11. The sensor of claim 10 wherein the integrated circuit further comprises a voltage amplifier;

the first and second substrates are bonded such that the respective bumps and target features electrically couple the inertial sensor and the voltage amplifier.

12. The sensor of claim 9 further comprising:

bonding material on the first substrate that forms a first ring and bonding material on the second substrate that forms a second ring, bonds between the first and second rings being thermocompressive bonds wherein least one of the first and second rings has been plastically deformed, and wherein bonds between respective bumps and target features are thermocompressive bonds, at least one of the bumps and target features being plastically deformed.

13. The sensor of claim 9 wherein the first substrate comprises a silicon-on-insulator substrate.

14. The sensor of claim 9 wherein the microelectromechanical device comprises a high aspect silicon-on-insulator structure.

15. The sensor of claim 9 wherein the microelectromechanical device comprises at least one silicon layer.

16. A sensor comprising:

a first substrate;

a sensing device disposed on the first substrate and having electrical terminals comprising bumps of conductive bonding material;

a dielectric substrate which is in aligned confronting relation to the first substrate;

plural wire-bond pads disposed on the dielectric substrate;

plural target features of conductive bonding material disposed on the dielectric substrate, the target features being at least partially congruent and in electrical contact with the bumps of the first substrate; and plural conductive lines disposed on the dielectric substrate and extending from respective target features to the wire-bond pads;

the first substrate and the dielectric substrate being thermocompressively bonded together such that plural bumps are bonded to respective ones of the target features to thereby form electrical connections having low-parasitic capacitance from the sensor to the wire-bond pads.

17. The sensor of claim 16 further comprising a second substrate; and an integrated circuit disposed on the second substrate and having electrical terminals comprising wire-bonds pads;

wherein the wire-bond pads of the dielectric substrate are electrically coupled to the wire-bond pads of the second substrate such that the sensing device is electrically coupled to the integrated circuit.

18. The sensor of claim 16 wherein the sensor is an inertial sensor comprising a mass flexurally suspended from the first substrate and having terminals capacitively coupled to the mass such that the capacitance between the terminals and the mass varies as the mass is displaced; and the integrated circuit is a capacitive readout circuit.

19. The sensor of claim 16 wherein the dielectric substrate is at least substantially transparent; and the sensing device is a diode detector.

20. The sensor of claim 16 wherein the first substrate comprises a silicon-on-insulator substrate.

21. The sensor of claim 16 wherein the sensing device comprises a high aspect silicon-on-insulator structure.

22. The sensor of claim 16 wherein the sensing device comprises at least one silicon layer.

23. A sensor comprising:

a first substrate;

a sensing device disposed on the first substrate and having electrical terminals comprising bumps of conductive bonding material;

a first dielectric substrate which is in aligned confronting relation to the first substrate;

plural wire-bond pads disposed on the first dielectric substrate;

plural target features of conductive bonding material disposed on the dielectric substrate, the target features being at least partially congruent and electrically coupled with the bumps of the first substrate;

plural conductive lines disposed on the first dielectric substrate and extending from respective target features to the wire-bond pads of the first dielectric substrate;

the first substrate and the first dielectric substrate being bonded together such that plural bumps are bonded to respective ones of the target features to thereby form electrical connections from the sensor to the wire-bond pads;

a second substrate;

an integrated circuit disposed on the second substrate and having electrical terminals comprising bumps of conductive bonding material;

a second dielectric substrate which is in aligned confronting relation to the second substrate;

plural wire-bond pads disposed on the second dielectric substrate;

plural target features of conductive bonding material disposed on the second dielectric substrate, the target features being at least partially congruent and electrically coupled with the bumps of the second substrate; and plural conductive lines disposed on the second dielectric substrate and extending from respective target features to the wire-bond pads of the second dielectric substrate;

the second substrate and the second dielectric substrate being bonded together such that the plural bumps are bonded to respective ones of the target features to thereby form electrical connections from the integrated circuit to the wire-bond pads; and wherein the wire-bond pads of the first dielectric substrate are electrically coupled to the wire-bond pads of the second dielectric substrate such that the sensing device is electrically coupled to the integrated circuit with extremely low parasitic capacitance.

24. The sensor of claim 23 wherein the sensing device is an inertial sensor comprising a mass flexurally suspended from the first substrate and having terminals capacitively coupled to the mass such that the capacitance between the terminals and the mass varies as the mass is displaced; and the integrated circuit is a capacitive readout circuit.

25. The sensor of claim 23 wherein the integrated circuit further comprises a voltage amplifier.

26. The sensor of claim 23 wherein the first dielectric substrate is at least substantially transparent; and the sensing device is a diode detector.

27. The sensor of claim 23 wherein the first substrate comprises a silicon-on-insulator substrate.

28. The sensor of claim 23 wherein the sensing device comprises a high aspect silicon-on-insulator structure.

29. The sensor of claim 23 wherein the sensing device comprises at least one silicon layer.

* * * * *

UNITED STATES PATENT AND TRADEMARK OFFICE
CERTIFICATE OF CORRECTION

PATENT NO.       : 7,276,789 B1
APPLICATION NO.  : 10/851751
DATED            : October 2, 2007
INVENTOR(S)      : Michael B. Cohn and Joseph T. Kung It is certified that error appears in the above-identified patent and that said Letters Patent is hereby corrected as shown below:

Title Page,
Item (56) References Cited

Please Insert references cite Nos. A1-A7 as follows:

| US-6,596,117 | 07-22-2003 | Hays et al. |
|---|---|---|
| US-6,429,511 | 08-06-2002 | Ruby et al. |
| US-6,265,246 | 07-24-2001 | Ruby et al. |
| US-6,177,730 | 01-23-2001 | Kira et al. |
| US-6,137,184 | 10-24-2000 | Ikegami |
| US-5,821,161 | 10-13-1998 | Covell II et al. |
| US-5,731,636 | 03-24-1998 | Chun |

Signed and Sealed this

Twenty-fourth Day of June, 2008

JON W. DUDAS
*Director of the United States Patent and Trademark Office*